United States Patent [19]

Swanson

[11] Patent Number: 4,555,783
[45] Date of Patent: Nov. 26, 1985

[54] METHOD OF COMPUTERIZED IN-CIRCUIT TESTING OF ELECTRICAL COMPONENTS AND THE LIKE WITH AUTOMATIC SPURIOUS SIGNAL SUPPRESSION

[75] Inventor: Mark Swanson, Arlington, Mass.

[73] Assignee: GenRad, Inc., Concord, Mass.

[21] Appl. No.: 373,809

[22] Filed: Apr. 30, 1982

[51] Int. Cl.⁴ .............................................. G01R 31/28
[52] U.S. Cl. ........................................ 371/15; 371/20
[58] Field of Search ............................ 371/15, 20, 25

[56] References Cited

U.S. PATENT DOCUMENTS

| 3,931,506 | 1/1976 | Borrelli et al. | 371/20 |
| 4,070,565 | 1/1978 | Borrelli | 371/20 |
| 4,216,539 | 8/1980 | Raymond et al. | 371/20 |
| 4,236,246 | 11/1980 | Skilling | 371/27 |

OTHER PUBLICATIONS

GenRad 2270 In-Circuit Test System brochure.
A. Mastrocola, "Effective Utilization of In-Circuit Techniques When Testing Complex Digital Assemblies", Automatic Testing & Test and Measurement '81 Session 2, Mar. 1981, pp. 106–117.
Brochure-PSC Quarterly, vol. 1, No. 3, Jul. 1980, Production Services Corporation, Waltham, MA.

Primary Examiner—Charles E. Atkinson
Attorney, Agent, or Firm—Rines and Rines, Shapiro and Shapiro

[57] ABSTRACT

This disclosure is concerned with suppressing spurious signals generated during the in-circuit testing of circuit components, and which spurious signals may interfere with test signals being forced at selected nodes of the circuit that are inputs to components being tested and wherein such spurious signals may be routed via certain of the other circuit components, by automatically inhibiting either potential transmission of spurious signals by applying specific signals to components identified by analysis as normally feeding or processing input signals to the component(s) under test, or automatically inhibiting all inhibitable input parts of all components identified as those capable of passing such spurious signals to the input of the component(s) under test.

10 Claims, 4 Drawing Figures

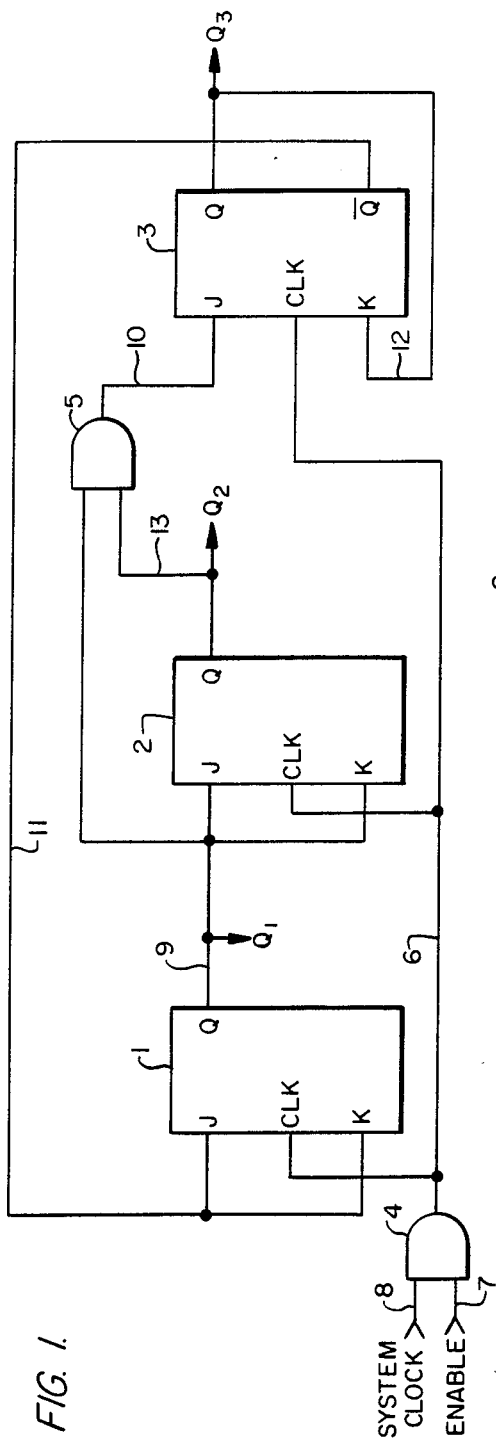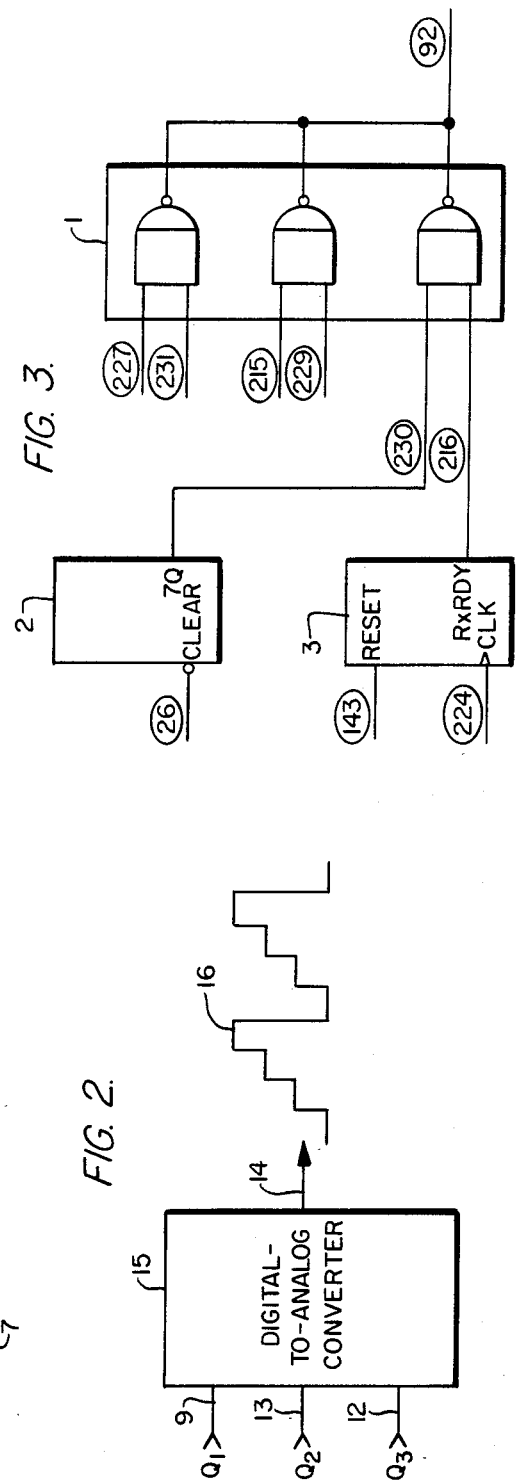

METHOD OF COMPUTERIZED IN-CIRCUIT TESTING OF ELECTRICAL COMPONENTS AND THE LIKE WITH AUTOMATIC SPURIOUS SIGNAL SUPPRESSION

The present invention relates to in-circuit computer-controlled testing of electrical components including integrated circuits (IC) in circuit boards and the like.

In-circuit testing is described, for example, in prior U.S. Pat. No. 4,236,246 of GenRad, Inc., the assignee of the present application, and in its 2270 In-Circuit Test System brochure JN4247 of May, 1981 and the associated 2270 Manual. Such testing is described also, as further illustrations, in U.S. Pat. No. 3,931,506, 4,070,565, and 4,216,539. In the cae of digital in-circuit testing, the IC computer library may contain a series of test steps used to verify the functions of digital components or devices. Automatic test generation (ATG) can alter these test steps as necessary, eliminating the need for special program debugging when a wiring configuration changes the function of the IC or prohibits back-driving. Examples include NAND gates that are wired as inverters, synchronous inputs to flip flops that are tied off to the voltage supply, or transmit and receive clock lines that are tied together. The automatic test generation package automatically compensates for such types of wiring configurations by selecting the appropriate procedures for the active functions of the device from the digital library.

Changes in the quiescent state of back-driven ICs, however, can lead to variations in the logic states driven at the inputs to the device or component under test. Double clocking of counters and other intermittent problems can occur at any time, even after a finished program is released. Feedback loops, through components connected to a component under test, as later more fully explained, may pass such spurious signals to the input of the component under test.

During such in-circuit testing, a simple series of component tests is effected by the in-circuit tester. It contacts the nodes of the circuit and forces test signals at selected nodes, thus, freeing these nodes from the influence the circuit would otherwise exert. The nodes selected for forcing test signals are inputs of components, and the procedure allows the components effectively to be isolated from the circuit and tested as though they were not a part of it. The output signal of a component under test, however, may be routed by the circuit back around to the input of the same circuit. This spurious signal arriving at the input via a feedback path will often interface with the tester forcing signal in a manner that produces unexpected test results and false error indication.

Although feedback paths are a common and obvious source of interfering spurious signals, such signals may also stem from other sources such as oscillators that may be part of the circuit, and control and clock lines that are shared by components, as before stated.

Considering, for example, the case of a flip-flop circuit component, such as that described in an article entitled "Effective Utilization of In-Circuit Techniques When Testing Complex Digital Assemblies", by A. Mastrocola, appearing in the conference proceedings of the Automatic Testing & Test and Measurement Session 2, at Wiesbaden, Mar. 23-26, 1981, pages 106-117, at 111, during a test, driver and sensor circuits would be connected to each node of the circuit. A feedback path from the flip flop through an input gate to the flip-flop clock input node, however, can conduct the flip-flop output back to its input. Ideally, the driver connected to the node should suppress this feedback and hold the node in the high state; but in practice, it is extremely expensive to make drivers responsive enough to mask out the effect of such a feedback signal, particularly because they may be connected through some length of wire. As a consequence, the node will respond to the spurious feedback signal momentarily while the driver is detecting the voltage deviation and responding to bring the node back to its driven state, producing a spurious negative pulse that can cause the flip-flop to change state, resulting in a flip-flop output state other than that anticipated.

More generally, in complex digital assemblies with bus-structured boards with many LSI devices or components, back-driving techniques alone cannot and do not always ensure total isolation of the component under test from surrounding circuitry—a tester being incapable of always clearly maintaining anode at a desired back-driven or forced test signal state. In said Mastrocola article, proposals for assisting in enabling isolation are presented involving intelligently generated test sequence and strategies involving complex digital guarding techniques. Another approach for trying to obviate this problem is described in Vol. 1, No. 3, Production Services Corporation PSC Quarterly, July, 1980, by adding capacitors from the physical probe point to ground with short leads to try to avoid "sneak" spurious pulses. In other cases, the test has been modified, often to degrade it by eliminating sensing of the upset state, and sometimes to change the test to block the feedback where this was possible. Clips that shorted signals on feedback paths have been added to the circuit temporarily. Such prior attempts at solution of the spurious signal interference with the back-driven or forced test signal applied to the component under test, however, have been manual and deleteriously labor-intensive.

In accordance with the present invention, on the other hand, the automatic test generation is adapted to anticipate where feedback loops might cause unwanted or spurious signals to propagate back to a device, analyzing the circuit to identify all IC's which must be placed in a constant logic inhibit state to block such spurious signals. Feedback squelch or suppression procedures from the IC library are used to create a constant state for a particular back-driven IC's output during testing, with such automatic suppression significantly reducing, and sometimes totally eliminating, the time spent tracing signals.

An object of the invention, accordingly, is to provide a new and improved method of in-circuit testing, not subject to the above-described limitations, and automatically suppressing spurious signal transmission to the input of a component under test that is being back-driven or forced with a test signal and subject to interference from such spurious signal.

A further object is to provide an improved method of computer-aided in-circuit testing with suppressed spurious signal interference of general applicability both to digital and analog circuits.

Other and further objects will be explained hereinafter and are more particularly delineated in the appended claims.

In summary, however, from one of its broader aspects, the invention embraces a method of computerized in-circuit testing of components in circuit boards and the like, that comprises, forcing test signals under computer program control at selected nodes of the circuit that are inputs of selected components, thereof, effectively to isolate other such components from the circuit and enable testing thereof as though such were not a part of the circuit; and suppressing possible spurious signals generated during such testing including the routing by the circuit of an output signal of a component under test via feedback paths to the input in interference with the forcing test signal and other spurious signal sources and paths shared by components, by:

1. Analyzing the circuit to identify those circuit components that normally feed or process input signals to the component under test and are thus potential components for the passing of said spurious signals, and automatically
2. identifying all components that are capable of feeding or processing input signals to the component(s) under test and are thus potential components for the conveyance of said spurious signals and automatically inhibiting all inhibitable spurious-signal input paths to the circuit under test by application of specific signals to said identified components prior to or during the conduct of the test of the component(s) under test, irrespective of the potential of the said identified components for being part of a source of said spurious signals; this technique being performed with some, but not extensive, circuit analysis. Preferred and best mode details are hereinafter presented.

In accordance with the invention, two important implementations or techniques are significant, as before stated; first, analyzing the circuit to identify actual paths spurious signals can take, and automatically inhibiting only these; and secondly, automatically inhibiting all possible spurious signal input paths with some, though not extensive, circuit analysis.

In the first case, the number of driver circuits required is less, since such technique generally deals with fewer than all possible inhibit signal nodes. The test time may also be less, but substantial computer time is required for analysis during automatic test generation. The second approach requires less computer power (memory), but needs more drivers and test time.

The invention will now be described in detail with reference to the accompanying drawing, FIG. 1 of which is a simplified block and circuit diagram showing a component under digital in-circuit test, and surrounding components that could, if not inhibited, feed back interfering spurious signals to the component input, and operating in accordance with the second technique of the invention before discussed;

FIG. 2 is a similar view showing the invention applied to analog testing;

FIG. 3 is a partial circuit diagram correlated to specific exemplary spurious signal path inhibitions in an illustrative test program.

Figure 4:
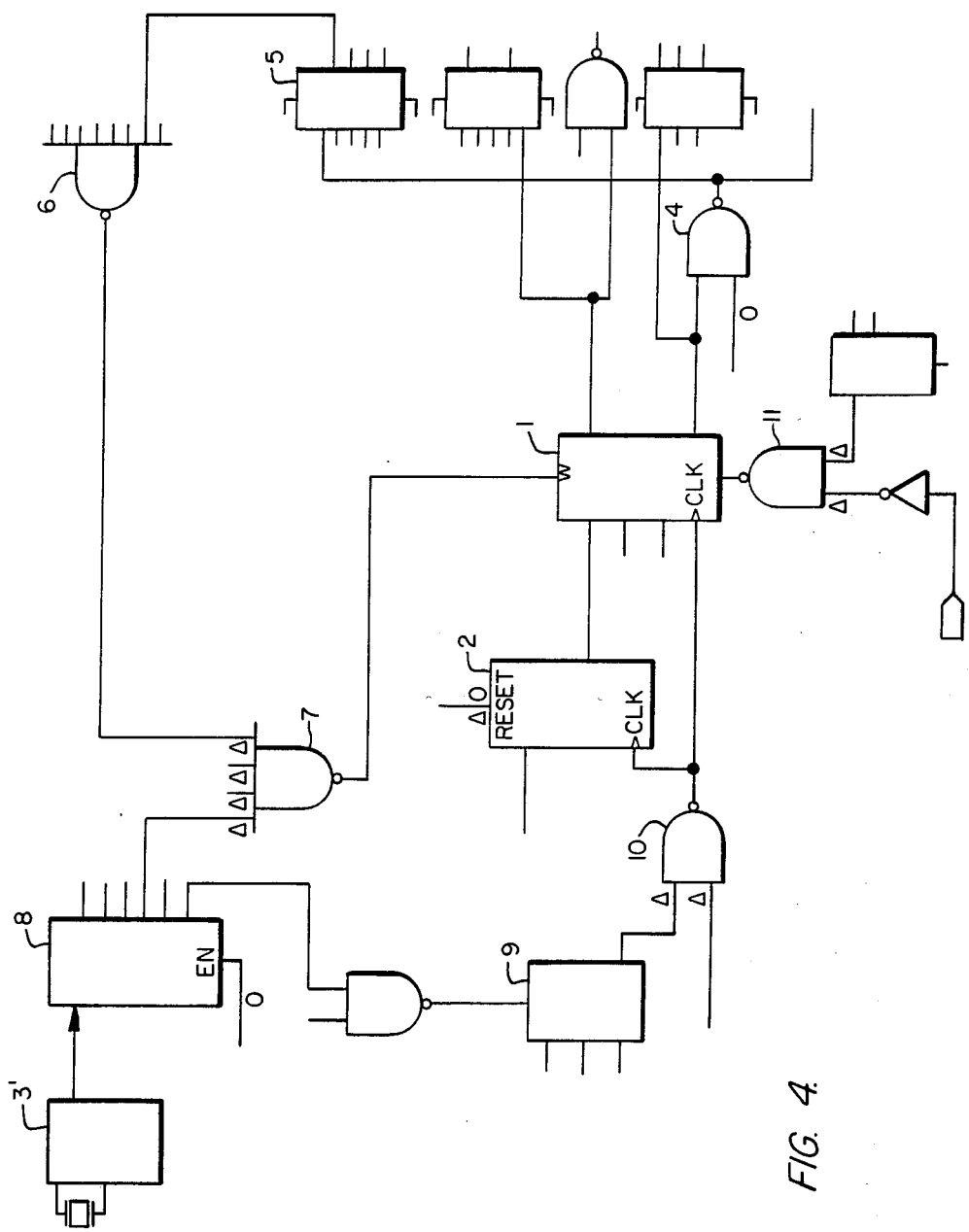
FIG. 4 is a somewhat more detailed circuit diagram typifying the type of circuits with which the spurious signal suppression techniques of the invention are particularly applicable.

Referring to FIG. 1, illustrating the application of the invention to digital circuits, a portion of a typical circuit under test is illustrated embodying three JK-type flip-flop components 1, 2, and 3, which, with two AND-gate components 4 and 5 form a divide-by-5 counting circuit. The textbook "Designing with TTL Integrated Circuits," edited by R. L. Morris and J. R. Miller, McGraw-Hill, 1971, for example, describes such circuits in Chapter 10. FIG. 1 does not show connectors between all circuit nodes and the testing apparatus in order to simplify the illustration.

There are two sources of potentially test-damaging spurious signals when testing flip-flop 1 that may be identified by analysis. The first is due to the common clock signal on node 6 that is derived from a signal, SYSTEM CLOCK, operative during the test. This signal can interfere with the signal on node 6 applied by the test apparatus. The method of the invention suppresses such inteference by driving or applying a low logic signal from the test apparatus to node 7 of gate 4 (ENABLE), thus inhibiting transfer of the SYSTEM CLOCK signal 8 to node 6.

The second identified source of spurious signal is via a feedback path from the Q output of the flip-flop 1 under test, via node 9 to flip-flop 2 and gate 5. From node 9 the signal propagates through 2 and 5 to node 10, allowing flip-flop 3 to send a signal back to 1 via node 11. The fedback circuit signal on node 11 could interfere with test-apparatus signals on the same node. In this case, the method of the invention inhibits spurious pulses by applying overriding, driving or forcing low logic signals to flip-flop 3 at its J and K inputs, nodes 10 and 12. This would suppress state transitions of 3 and thus break or inhibit the feedback loop.

An alternative technique for breaking the feedback loop would be to operate the circuit in such a manner as to place flip-flop 3 in its low-output (11) state, and then to inhibit further state change by applying a low state solely to node 13, the input of gate 5. This would require more circuit-analysis processing during automatic test generation, but would reduce the number of inhibit signals.

More generally considered, the steps that have been performed in accordance with this technique of the invention, as simply explained in connection with FIG. 1, are:

1. Identifying those circuit components that normally feed or process input signals to the component under test, including those that may feed back signals from the component(s) under test. The identified components must then be the ones that pass any spurious signals, whether feedback or other type.
2. Determining or identifying what must be done to the identified components, or how to inhibit signal transmission through them. (As another example, signals can be inhibited on and AND gate input by placing any other inputs in the low, or false state.)
3. Expanding the normal in-circuit test:
   a. to employ drivers at the inputs to the selected identified components; and
   b. to add to the normal test a preamble that causes the added drivers to cause the selected components to inhibit signal transmission to the input of the components(s) under test.

The power of this technique is that it can be implemented automatically. The inhibit states can be added to the component test library normally used in developing all the in-circuit tests. The inhibit states do not, therefore, have to be identified each time a new circuit test is developed. The new test is merely assembled from the library using a computer program (ATG) which identified the components-to-be-inhibited as part of the assembly process. Automatic implementation is so efficient that inhibiting can be done as a matter of course, rather than on an as-required basis. This eliminates the labor intensive task of finding the cause of a failing test of a good component and implementing inhibiting. Inhibiting is applied in this embodiment to all inhibitable input paths to the component under test, regardless of their potential for being part of a source of spurious signal. The invention therefore makes it unnecessary to analyze the circuit for such sources, which is a complex activity, requires considerable computer power (memory) and is susceptible to error.

While shown applied to digital testing in FIG. 1, the underlying method of this form of the invention is also useful for analog testing. An example is shown in FIG. 2, as combined with the circuit of FIG. 1, and which extends the operation for analog use.

A digital-to-analog converter component 15 having digital inputs 9, 12 and 13 is shown connected to the Q outputs (Q1, Q2 and Q3) of the counter of FIG. 1. Normal circuit operation produces an analog output 14 that is a stepped wave-form 16. The analog test in this illustration consists of measuring the voltages at output 14 corresponding to digital input states at 9, 12 and 13. The testing apparatus would apply signals to these digital input nodes and conduct voltage measurements at 14. If, however, during the test, the circuit under test produced a clock signal on node 6, one or more of the flip-flop components could change state to produce a spurious signal at nodes 9, 12 or 13, resulting in a momentary error in output voltage 14. In accordance with the method of the invention, a low state would automatically be applied at node 6 to suppress such errors.

As previously intimated, the advantage of this form of the invention (so-called second technique above-described) wherein some analysis is effected to identify all components that are capable of feeding or processing input signals to the component(s) under test and are thus potential components for the passing or conveying of spurious signals, and then automatically inhibiting all inhibitable spurious-signal input paths by specific driving signals to such identified components prior to or during the conduct of the test of the component(s) under test, resides in the requirement of less analysis and thus computer power than if only the actual paths that spurious signals can take are identified and only those paths are inhibited (so-called first technique above). Still, this latter technique is useful and, as memory becomes less expensive, is attractive in requiring fewer driver circuits and dealing, generally, with fewer than all possible inhibit signal nodes.

An illustrative example of part of a test program showing the described spurious-signal suppression is illustrated by the fragmentary circuit of FIG. 3, as applied to flip flop components 1, 2 and 3, supplemented by the partial sequence notated in programming format, below.

Referring to FIG. 3, the first gate in component 1, called "U25" in the test program, combines two signals from device 2 (called "U17") and device 3 (called "U8") onto a timing bus. To test the gate, the other gates in flip flop component 1 must be disabled. For this reason, nails 215, 227, 229, and 231 are driven low to disable these open collector gates. To prevent spurious signals from interfering with the test, devices 2 and 3 are inhibited. For component 2, however, this requires only driving one line low, forcing it into its clear state. Putting component 3 into its "reset" (known inactive) state requires Reset high and clocking it eight times. After this has been done, device 1 may reliably be tested, since neither device 2 nor device 3 can pass spurious signals.

As before stated, this may be described as in the following partial program wherein U25, U17 and U8 are the components above identified and the numbers in parentheses correlate with the corresponding nodes, connection points or nails also above identified and shown in FIG. 3.

```
U25:    BURST IST = 10U; /* (7403) */
        /* Inhibit U8 */
        $ IC(143) IH(143);
        LOOP = 8 $ IC(224) IH(224);
        $ IL(224) END LOOP;
        $ ID(224);
        /* For U17 U25 */
        IC(26,215,227,229,231) IL(26,215,227,229,231);
/** TEST PROGRAM FOR IC U25 el (7403)
PIN NAIL COMMENT
1 230
2 216
3 92
**/
        $ PU(92);
        IC(216,230) IL(216,230) OS(92) OH(92);
        IH(216);
        IH(230) OL(92);
        IL(216) OH(92);
        END BURST;
```

In illustration of a more detailed type of circuit in which the spurious signal suppression techniques of the invention are useful, reference is made to FIG. 4, showing three spurious signal sources: first, a parallel signal through flip flop component 2, which shares a clock line with flip flop component 1; second, a signal from an independent clock device 3[1]; and third, a feedback loop signal through gates 4, 5, 6, and 7. The many other devices, illustrated with conventional symbols, and other signals involved would make interference by these spurious signals intermittent and thus hard to diagnose or suppress. These signals are all suppressable by back-driving appropriate input pins. In accordance with the second approach or technique of the invention before detailed, signal transmission may be suppressed on all devices that drive component 1; namely, devices 2, 7, 10, and 11. The nine nodes that might be a typical choice are marked with the symbol "Δ" in FIG. 4. Alternatively, in accordance with the first approach of the invention using more extensive analysis, it may be determined that there are only three sources of spurious signals, and these may be suppressed by backdriving only three nodes, illustrated at the points marked with the symbol "0" at devices 2, 4, and 7.

Further modifications will occur to those skilled in this art and such are considered to fall within the spirit and scope of the invention as defined in the appended claims.

What is claimed is:

1. A method of computerized in-circuit testing of components in circuit boards and the like, that comprises, forcing test signals under computer program control at selected nodes of the circuit that are inputs of the components thereof, effectively to isolate such components from the circuit and enable testing thereof as though such were not a part of the circuit; and suppressing possible spurious signals generated during such testing including the routing by the circuit of an output signal of a component under test via feedback paths to the input in interference with the forcing test signal and other spurious signal sources and paths shared by components, by:
  (a) identifying circuit components feeding or processing input signals to the component(s) under test and that can pass said spurious signals; and
  (b) automatically inhibiting potential transmission of spurious signals by applying specific signals to the identified components prior to or during the testing of the component(s) under test.

2. A method as claimed in claim 1 and in which said step of identifying circuit components is effected by identifying those components that normally feed or process input signals to the component(s) under test, including those that may feed back signals from the components(s) under test, and thus are the components that can pass said spurious signals; and said step of automatically inhibiting potential transmission of spurious signals by application of specific signals is effected for the identified components only.

3. A method as claimed in claim 1 and in which said step of identifying circuit components is effected by identifying all components that are capable of feeding or processing input signals to the component(s) under test and are thus potential components for the conveying of said spurious signals; and said step of automatically inhibiting is effected by inhibiting all inhibitable spurious-signal input paths to the circuit under test by application of specific signals to the identified components irrespective of the potential of said identified components for being part of a source of said spurious signals; and eliminating the effect of said spurious signals without the necessity for analyzing the circuit for sources of said spurious signals.

4. A method as claimed in claim 1 and in which said inhibiting is effected by driving the inputs to the identified components to an inhibit state.

5. A method as claimed in claim 4 and in which the program for effecting said testing is stored in a test library, and the inhibit states for inhibiting said identified component inputs are also thusly stored so that the same do not have to be identified each time a new circuit test is developed, but such new test is assembled from the said library following identifying the components to be inhibited as part of the assembly process.

6. A method as claimed in claim 5 and in which said identifying and driving steps comprise identifying how to inhibit signal propagation for each component, and then applying the same to all components which drive inputs of the component under test.

7. A method as claimed in claim 6 and in which said component may comprise integrated circuit components.

8. A method as claimed in claim 6 and in which said inputs comprise an AND gate or the like and the inhibiting is effected by placing other inputs in a low or false state.

9. A method as claimed in claim 6 and in which said testing is one or both of digital and analog testing.

10. A method of suppressing spurious signals generated during the in-circuit testing of circuit components, and in which spurious signals may interefere with test signals being forced at selected nodes of the circuit that are inputs to components being tested, wherein such spurious signals may be routed via certain of the other circuit components, said method comprising automatically inhibiting either potential transmission of spurious signals by applying specific signals to components identified by analysis as normally feeding or processing input signals to the component(s) under test, or automatically inhibiting all inhibitable input parts of all components identified as those capable of passing such spurious signals to the input of the component(s) under test.

* * * * *